United States Patent [19]
Cohen et al.

[11] Patent Number: 5,737,137
[45] Date of Patent: Apr. 7, 1998

[54] CRITICAL ILLUMINATION CONDENSER FOR X-RAY LITHOGRAPHY

[75] Inventors: Simon J. Cohen, Pleasanton; Lynn G. Seppala, Livermore, both of Calif.

[73] Assignee: The Regents of the University of California, Oakland, Calif.

[21] Appl. No.: 617,719

[22] Filed: Apr. 1, 1996

[51] Int. Cl.$^6$ .................... G02B 5/10; G02B 17/00; G21K 1/06; G21K 5/00
[52] U.S. Cl. ............... 359/859; 359/861; 359/355; 359/366; 378/34; 378/70; 378/84; 355/67
[58] Field of Search ............... 359/365, 366, 359/730, 731, 858, 859, 861, 350, 351, 355, 359; 378/34, 35, 70, 84; 355/53, 60, 66, 67

[56] References Cited

U.S. PATENT DOCUMENTS

| | | | |
|---|---|---|---|
| 2,628,529 | 2/1953 | Braymer | 359/366 |
| 3,674,334 | 7/1972 | Offner | 359/366 |
| 4,101,195 | 7/1978 | Korsch | 359/366 |
| 4,655,592 | 4/1987 | Allemand | 359/859 |
| 4,805,002 | 2/1989 | Sasago et al. | 355/67 |
| 5,136,422 | 8/1992 | Ukon | 359/366 |
| 5,144,497 | 9/1992 | Kato et al. | 359/859 |
| 5,239,404 | 8/1993 | McLaughlin et al. | 359/861 |
| 5,315,629 | 5/1994 | Jewell et al. | 378/34 |
| 5,353,322 | 10/1994 | Bruning et al. | 378/34 |
| 5,386,316 | 1/1995 | Cook | 359/861 |

OTHER PUBLICATIONS

S.J. Cohen et al, "Critical Illumination Condenser for EUV Projection Lithography", OSA Proceedings on Extreme Ultraviolet Lithography, 1994, vol. 23, Apr. 1995, pp. 109–115.

N.M. Ceglio et al, "Front–End Design Issues In Soft X–Ray Projection Lithography", Applied Optics, vol. 32, 7050–7056, 1993.

G.E. Sommargren, "Performance of a Two Mirror, Four Reflection, Ring Field Imaging System", OSA Proceedings on Extreme Ultraviolet Lithography, 1994, pp. 103–108.

L.A. Hackel et al, "Laser Driver For Soft–X–Ray Projection Lithography", Applied Optics, vol. 32, 6914–6919, 1993.

R.L. Kauffman et al, "X–Ray Production at 13nm From Laser–Produced Plasmas for Projection X–Ray Lithography Applications", Applied Optics, vol. 32, 6897–6900, 1993.

G.E. Sommargren et al, "Condenser Optics, Partial Coherence, and Imaging for Soft–X–Ray Projection Lithography", Applied Optics, vol. 32, 6938–6944, 1993.

Primary Examiner—Ricky D. Shafer
Attorney, Agent, or Firm—Henry P. Sartorio; L. E. Carnahan

[57] ABSTRACT

A critical illumination condenser system, particularly adapted for use in extreme ultraviolet (EUV) projection lithography based on a ring field imaging system and a laser produced plasma source. The system uses three spherical mirrors and is capable of illuminating the extent of the mask plane by scanning either the primary mirror or the laser plasma source. The angles of radiation incident upon each mirror of the critical illumination condenser vary by less than eight (8) degrees. For example, the imaging system in which the critical illumination condenser is utilized has a 200 μm source and requires a magnification of 26×. The three spherical mirror system constitutes a two mirror inverse Cassegrain, or Schwarzschild configuration, with a 25% area obstruction (50% linear obstruction). The third mirror provides the final pupil and image relay. The mirrors include a multilayer reflective coating which is reflective over a narrow bandwidth.

11 Claims, 3 Drawing Sheets

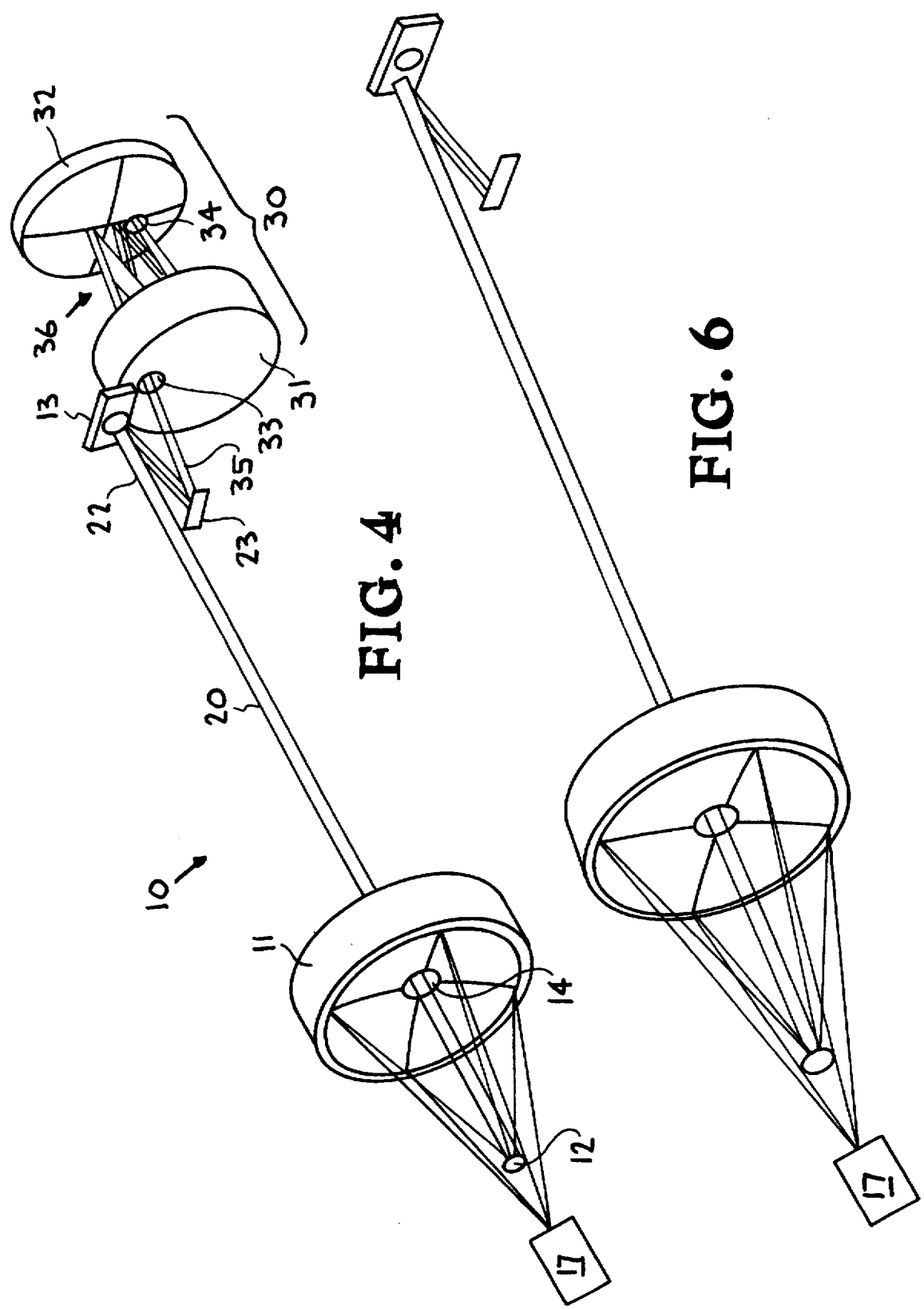

CRITICAL ILLUMINATION CONDENSER FOR X-RAY LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to imaging systems, particularly to critical illumination condenser systems for x-ray lithography, and more particularly to a three spherical mirror critical illumination condenser system.

In photo-lithography, a condenser optical system couples radiation from a source to illuminate a mask plane which is relayed onto a wafer by an imaging system, as schematically illustrated in FIG. 1. There are two types of condenser illumination systems. A Kohler illumination condenser images the source plane onto the entrance pupil of the imaging system while the aperture stop of the condenser is imaged onto the mask plane. A critical illumination condenser images the source onto the mask plane while the aperture stop of the condenser is relayed to the entrance pupil of the imaging system. See S. J. Cohen et al., "Critical Illumination Condenser for EUV Projection Lithography", OSA Proceedings on Extreme Ultraviolet Lithography, 1994, Vol. 23, Optical Society of America, published in April of 1995.

Soft x-ray projection lithography is being actively developed, as exemplified by the development efforts at Lawrence Livermore National Laboratory (LLNL) and AT&T/Sandia. These lithography systems utilize front end critical illumination condensers. LLNL, in their soft x-ray projection lithography project, currently operates an extreme ultraviolet projection lithography (EUV) system with a Kohler illumination condenser. (See N. M. Ceglio et al., "Front-end design issues in soft x-ray projection lithography", Applied Optics, Vol. 32, 7050–7056 (1993); and G. E. Sommargren, "Performance of two mirror, four reflection, ring field imaging system", OSA Proceedings on Extreme Ultraviolet Lithography, 1994. FIG. 2 is a schematic of the LLNL system. As shown, a laser beam (laser driver) incident upon a tungsten rod generates EUV radiation, in the 13 nm regime, which is collected by a three spherical mirror Kohler illumination system. (See L. A. Hacket et al., "Laser driver for soft x-ray projection lithography", Applied Optics, Vol. 32, 6914–6919, (1993); and R. L. Kauffman et al., "X-ray production at 13 nm from laser-produced plasma for projection x-ray lithography applications", Applied Optics, Vol. 32, 6897–6900, (1993). This radiation is directed toward a reflective mask which is imaged onto the wafer plane by the imaging system. The optical system is a ring field imaging system, where the image of the mask at the wafer is only acceptable over a ring shape which in this case is 4.5 mm wide with an inner diameter of 75.1 mm. A comparison between the Kohler illumination condenser system and a critical illumination condenser using this same ring field imaging system is underway. Design of a critical illumination system which meets the challenges associated with EUV lithography and works with the current imaging system has been undertaken.

There are a number of other requirements for the critical illumination condenser, in addition to the placement of the image plane and exit pupil location, which must be met by this optical system. The magnification of the pupil relay is an important factor which can effect the uniformity and partial coherence requirements of the imaging system. The exit pupil of the condenser system, which is relayed to the entrance pupil of the imaging system and subsequently to its aperture stop, is specified to achieve a 60% fill factor at the aperture stop of the imaging system. See G. E. Sommargren et al., "Condenser optics, partial coherence, and imaging for soft x-ray projection lithography", Applied Optics, Vol. 32, 6938–6944, (1993). The mirrors will need reflective coatings which satisfy the complex multilayer requirements and can realistically be manufactured. Multilayer mirror coatings for the EUV are only reflective over a narrow bandwidth and a small range of angles of incidence. The angles of radiation incident upon each mirror of the critical illumination condenser must vary by less than eight degrees at small angles. Higher angles of incidence have even tighter variation constraints. The current coating chamber dimensions also constrain the maximum diameter for any optic to approximately 100 mm.

Particulates (debris) emanate from the source along with the EUV radiation. A debris shield is necessary to protect the optics, that are closest to the source, from contamination. The particles cover the components and reduce the reflective properties of the mirrors. The debris shield must be placed at least 25 mm from the source, but even at this distance there is a gradual loss of transmission, to the shield, and it must periodically be replaced. The critical illumination condenser must also be able to scan over the extent of the ring of field imaging system. Since the imaging system already exists, the first order parameters for the condenser are all defined. The critical illumination condenser has a 200 μm source and requires a magnification of 26×, for application with the existing EUV lithography setup being used at LLNL. The above-described requirements for a critical illumination condenser, and particularly for the current LLNL EUV lithography setup are satisfied by the present invention. The critical illumination condenser of the present invention utilizes a three spherical mirror optical design that satisfies the scanning, uniformity, and partial coherence requirements of lithography by scanning either the primary mirror or the laser plasma source (laser driver). This invention meets the technical challenges of soft x-ray projection lithography based on a ring field imaging system and a laser produced plasma x-ray source. The three spherical mirror system is a two mirror inverse Cassegrain or Schwarzschild configuration with a 25% area obstruction, and the third mirror provides the final pupil and image relay. In addition, the requirements for a debris shield are satisfied.

SUMMARY OF THE INVENTION

It is an object of the present invention to provide a critical illumination condenser for an optical system.

A further object of the invention is to provide a critical illumination condenser for use in EUV lithography.

Another object of the invention is to provide a critical illumination condenser which meets the technical requirements of soft x-ray projection lithography based on a ring field imaging system and a laser produced plasma x-ray source including satisfying the requirements for a debris shield from debris emitted by the source.

Another object of the invention is to use spherical mirrors in the condenser whereby a mask can be scanned over its full width by tilting the primary mirror or by scanning the plasma source (shifting the position of the laser driver).

Another object of the invention is to provide a critical illumination condenser composed of three spherical mirrors which uses a two mirror inverse Cassegrain or Schwarzchild configuration with a 25% area obstruction, wherein the third mirror provides the final pupil and image relay.

Other objects and advantages of the present invention will become apparent from the following description and accompanying drawings. The invention is a critical illumination condenser particularly adapted for EUV lithography, but which can be utilized in other imaging systems. The invention meets the requirements for use in soft x-ray projection lithography based on a ring field imaging system and a laser produced plasma source. The critical illumination condenser of the present invention is a three spherical mirror optical arrangement which satisfies the scanning, uniformity, and partial coherence requirements of an x-ray projection lithography system using a laser plasma source by scanning either the primary mirror or the laser plasma source (laser driver). The invention also satisfies the requirements for a debris shield to protect the optics from debris emitted by the source. The critical illumination condenser is composed of three (3) spherical mirrors. The objective is a two mirror inverse Cassegrain or Schwarzschild configuration with a 25% area obstruction. The third mirror provides the final pupil and image relay. The critical illumination condenser optical arrangement is sufficiently versatile to be implemented, for example, into the current LLNL two element imaging system and the AT&T/Sandia three aspheric mirror imaging system, see S. J. Cohen et al., supra. Thus, the condenser of this invention, with a symmetric objective can collect more radiation from the source than the Kohler condenser. The invention can effectively replace the currently used Kohler illumination condenser which has a non-symmetric, off axis design, is difficult to align and cannot be scanned by moving across the source.

BRIEF DESCRIPTION OF THE DRAWINGS

The accompanying drawings, which are incorporated into and form a part of the disclosure, illustrate the prior art and an embodiment of the invention and, together with the description, serve to explain the principles of the invention.

FIG. 4 schematically illustrates the critical illumination condenser in conjunction with a two element imaging system for EUV projection lithography.

FIG. 6 illustrates scanning across a mask plane by the critical illumination condenser of FIG. 3.

DETAILED DESCRIPTION OF THE INVENTION

The present invention is directed to a critical illumination condenser for x-ray lithography. A critical illumination condenser system couples a radiation source to an imaging system in extreme ultra-violet (EUV) micro-lithography. Uniformity and partial coherence at the object of the imaging system effect the image properties. EUV projection lithography has, for example, a ring-field imaging system which images a mask onto a wafer. The critical illumination condenser of this invention images the plasma EUV source onto the mask plane of the imaging system and also images its pupil plane into the entrance pupil of the imaging system.

In the EUV regime, multilayer mirror coatings only work over finite bandwidths and a small range of angles of incidence. The condenser optical system of this invention satisfies the constrains for soft x-ray multilayer coatings, and is capable of a collection numerical aperture of 0.5 radians.

The mask of an EUV lithographic system, for example, is much larger than the image of the source created by the condenser lens system which only illuminates a small portion of the mask. The soft x-rays must be scanned over the mask to illuminate it full width. The three spherical mirror critical illumination condenser of this invention can be scanned by tilting the primary mirror or by scanning the plasma source (shifting the position of the laser driver).

The radiation source also emits a lot of debris. The condenser of this invention satisfies the requirement for a debris shield. The shield is necessary to prevent debris from covering the optics. The source debris eventually coats the shield and reduces the EUV transmission through the shield. The shield must be at least 25 mm away from the source, otherwise the shield loses transmission too quickly and must be replaced very frequently. The shield is replaceable, but the optics are expensive and can not be replaced as often as the shield.

The critical illumination condenser of this invention is composed of three spherical mirrors, wherein two mirrors provide an inverse Cassegrain or Schwarzschild configuration with a 25% area obstruction, and the third mirror provides the final pupil and image relay. Note that the reflective surface of the first or primary mirror is concave, the reflective surface of the second mirror is convex, and the reflective surface of the third mirror is slightly concave.

Figure 3:
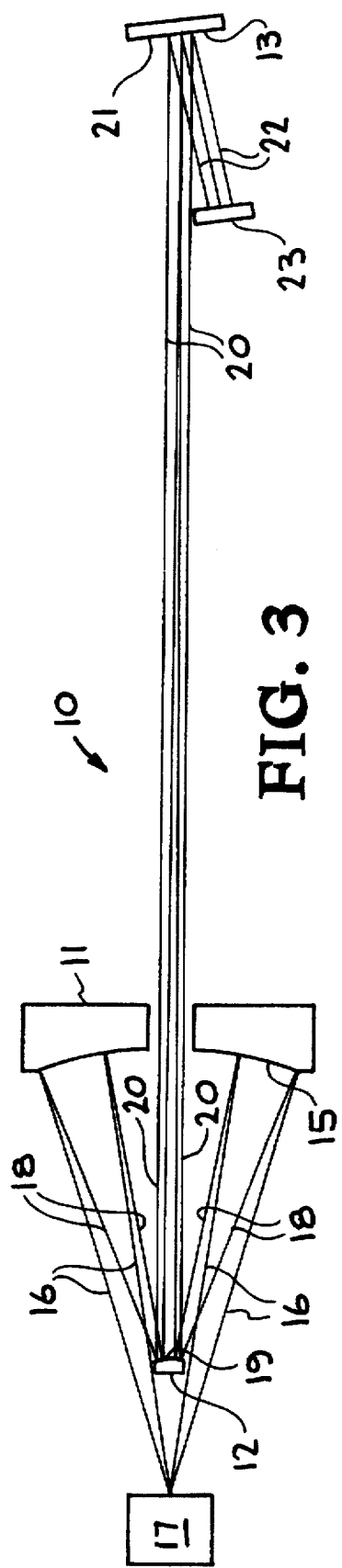
FIG. 3 illustrates an embodiment of the three spherical mirror critical illumination condenser made in accordance with the present invention.

The optical arrangement of this critical illumination condenser invention is illustrated in FIG. 3 and functions to reflect radiation energy from the source to the mask plane, which is the object plane of the imaging system. The condenser generally indicated at 10 consists of three (3) spherical mirrors indicated at 11, 12 and 13. The first mirror, primary mirror 11 is a concave reflective surface, 15, with a 100 mm diameter and a 15 mm hole 14. The source, 17, energy is collected by the primary mirror, which reflects said energy indicated at 16 from the source onto the second mirror 12, as indicated by 18. The second mirror 12 has a convex surface 19 and is positioned so as to be aligned on axis with the hole 14 of mirror 11 and reflects energy indicated at 18 from mirror 11 onto the third mirror 13, indicated at 20. The third mirror 13 has a concave surface 21, and is tilted with respect to the first two mirrors in order to direct the radiation 20 from mirror 12 onto a mask 23. This is indicated at 22 in FIGS. 3, 4 and 6.

Figure 1:
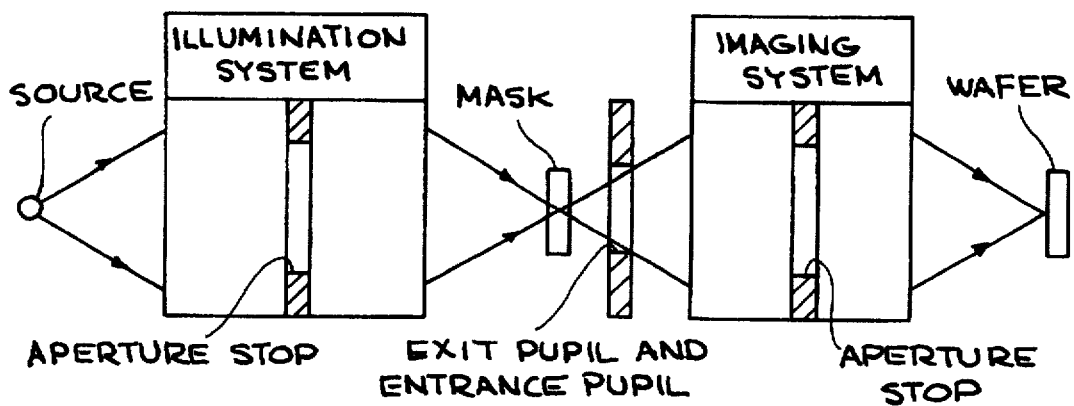
FIG. 1 schematically illustrate the EUV lithography system.
Figure 2:
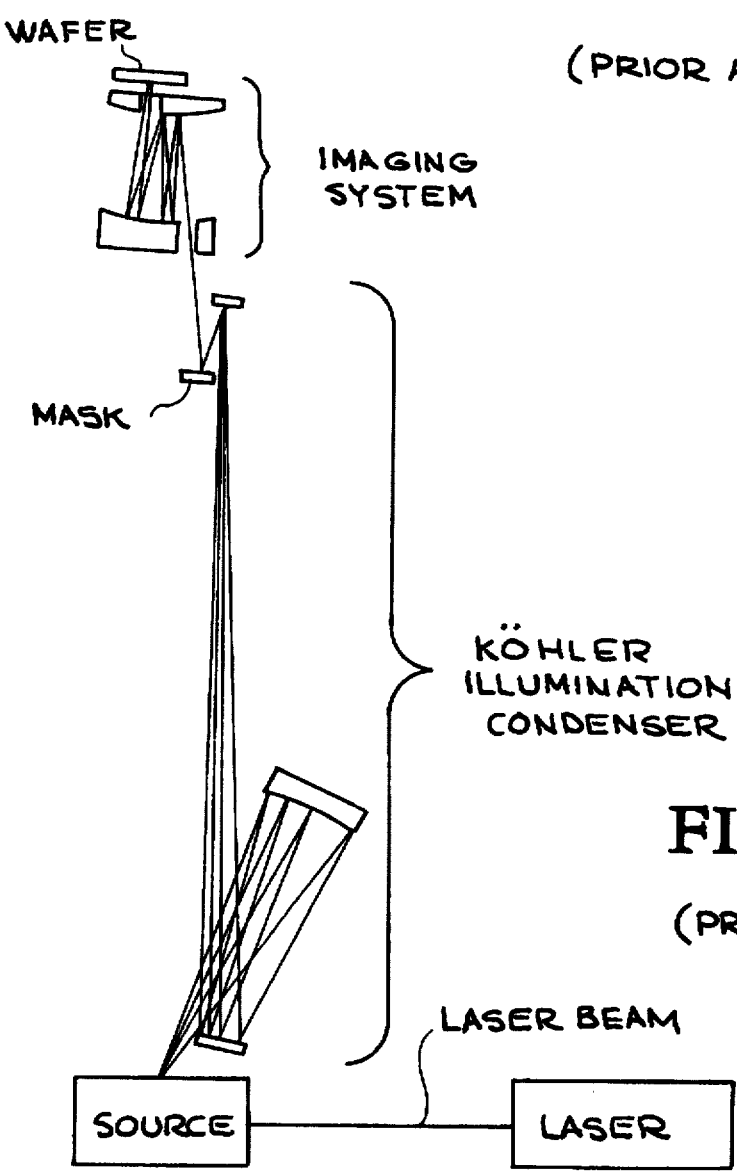
FIG. 2 schematically illustrates a current EUV lithography setup using the Kohler illumination condenser.

By way of example, mirror 11 has a diameter of 100 mm with a hole diameter of 15 mm, and mirrors 12 and 13 have diameters of 12.7 mm and 35 by 16 mm. Mirror 13 has a rectangular shape. The mirrors 11, 12, and 13 are each mounted in a support structure as known in the art, such as illustrated, for example, in FIG. 2a of the previously referenced article by S. J. Cohen et al.

The objective of the three spherical mirror arrangement of FIG. 3 is a two mirror (11 and 12) inverse Cassegrain or Schwarzschild configuration, with a 25% area obstruction (50% linear obstruction). The third mirror (13) provides the final pupil and image relay, as seen in FIG. 4. The numerical aperture of the FIG. 3 optical system is 0.3 radians (f/1.67) which is a solid angle covering 0.2 sr of radiation emitted by the source (out of 2π). This optical system is 505 mm long from the source 17 to the third mirror 13 (5 mm shorter than the Kohler illumination condenser of FIG. 2), and meets all the requirements for EUV lithography and for the imaging system. By way of example, mirror 11 has a reflective surface curvature of 134.66 mm, with reflective surface curvatures of mirrors 12 and 13 being 22.16 mm and 265.67 mm respectively.

FIG. 4 is a perspective view of the critical condenser of FIG. 3 with a two element imaging system. The FIG. 4 imaging system generally indicated at 30 is composed of having optical elements 31 and 32, with element 31 having an aperture 33 extending there through and element 32 having an aperture 34 extending there through. Energy indicated at 35 from mask 22 is directed through aperture 33 in optical element 31 onto optical element 32, and is reflected, as indicated at 36 between elements 32 and 31, and out via aperture 34 in element 32 onto a wafer or substrate (see FIG. 2 or FIG. 2a) S. J. Cohen et al. reference above).

Figure 5:
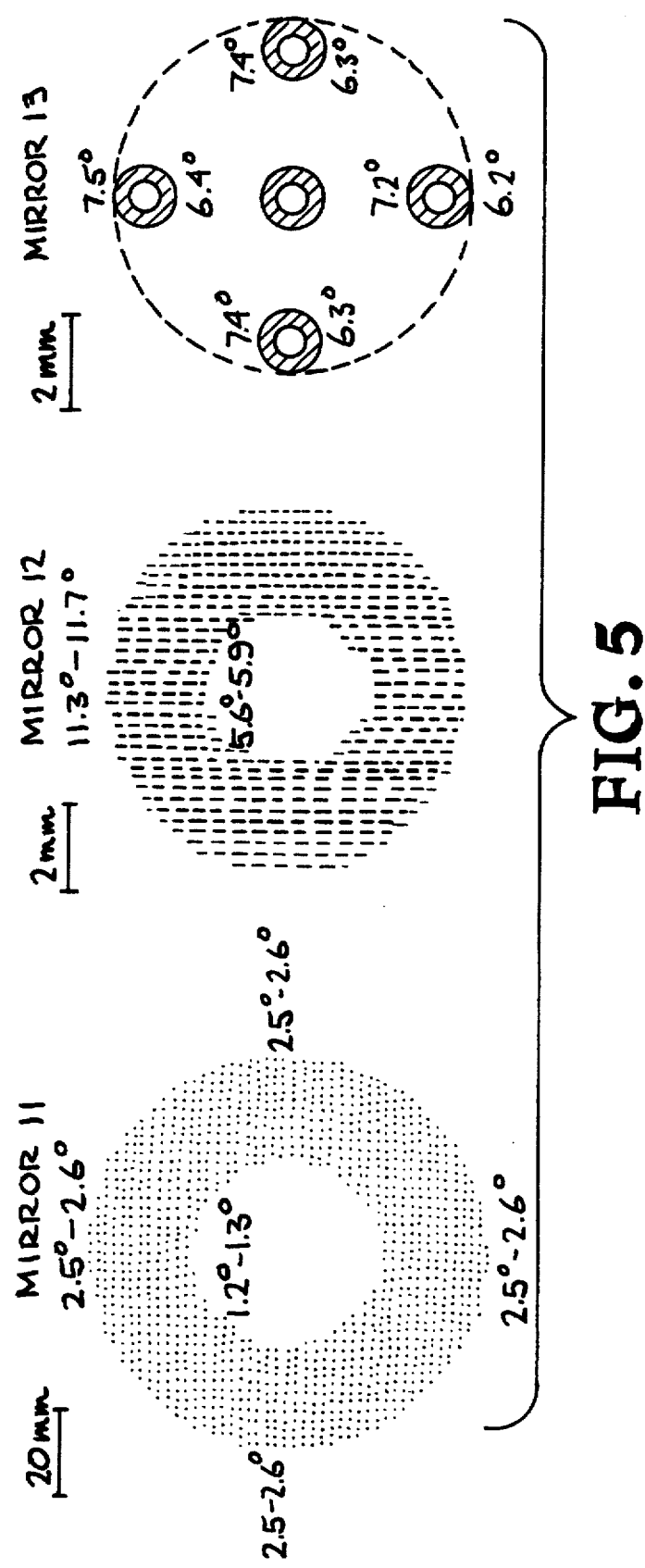
FIG. 5 illustrates the radiation footprints at each mirror of FIG. 3 along with angles of incidence.

A detailed analysis of the range of angles of incidence upon each mirror (11–13), for the full solid angle of incident radiation, is necessary to determine if the mirror coatings are realistic. FIG. 5 shows a beam footprint at each mirror (11–13) along with the radiation angles incident upon the surface of the mirrors. The footprint and angle analysis was accomplished by choosing five points at the source which are followed throughout the optical system to the image (mask) plane. The third mirror (13) image in FIG. 5 represent the footprint and angles for the five source points, and the dashed line represents the entire footprint from the 200 μm source. In all cases, as shown in FIG. 5, the variation of angles at each mirror is within the allowed eight degree spread, discussed previously. The mirrors 11–13 include multilayer reflective coatings as known in the art. FIG. 5 shows the range of angles of incidence for radiation incident upon the mirrors which is necessary to devise the EUV multilayer coatings.

The mask is much larger than the image of the source created by the condenser optical system, which only illuminates a small portion of the mask. The EUV radiation must be scanned over the extent of the mask to illuminate its full width. This is accomplished by the source being scanned and the resulting scan of radiation across the mask and wafer plane. The mask is scanned across the ring field region of the imaging system. The three spherical mirror critical illumination condenser of FIG. 3 can scan by shifting the position of the laser driver on the plasma source. Another way of accomplishing the same effect is by tilting the primary mirror 11 of the condenser. Since the first or primary mirror is the aperture stop of the condenser system, tilting this plane will not shift the radiation at the critical illumination exit pupil plane which is also the entrance pupil for the imaging system. So, the EUV radiation can be shifted across the mask plane without moving the aperture stop of the imaging system, consequently, the partial coherence of the imaging system is not affected. FIG. 6 is a view of the critical illumination condenser of FIG. 3 scanning radiation across the mask plane (note in FIG. 6 that the position of the radiation has shifted on the third mirror 13 and the mask plane, as compared to that illustrated in FIG. 4).

The greater the extent of the scanning across the mask plane the larger the incident angles will be on the second (12) and third (13) mirrors of the critical illumination condenser. However, the variation in these angles is less than a degree even over a 17 mm mask.

The critical illumination condenser illustrated in FIG. 3 is, as pointed out above, sufficiently versatile to be implemented into various optical imaging systems, such as the two element imaging system illustrated in FIG. 4 and currently utilized at LLNL, or the AT&T/Sandia 5×, three aspheric mirror, imaging system, each requiring a front end illumination condenser. While the two element imaging system of FIG. 5 has a length of 505 mm from the source to the third mirror, the overall length of the AT&T/Sandia imaging system is greater than 1.6 m, and a collection angle of 0.5 radians (f/1) with a 60% linear obstruction, so the solid angle is 0.5 sr. The condenser system of this invention can be utilized in various imaging systems of various lengths, from source to third mirror.

In a critical illumination condenser the uniformity of the source is an important factor which can affect the imaging of the mask onto the wafer. Since the source is imaged onto the mask plane in a critical illumination design, any non-uniformities in the source plane will appear at the mask plane and subsequently on the wafer. These non-uniformities will be source dependent and may be of concern. However, the potential advantages of the critical illumination system over a Kohler illumination condenser are quite dramatic. The critical illumination condenser can collect a much larger solid angle from the source than the Kohler condenser, and has an on-axis symmetric objective. In contrast, the Kohler condenser is a non-symmetric, off axis design which is more challenging to align. Finally, the critical illumination condenser is more practical for scanning radiation across the mask. A Kohler condenser cannot be scanned by moving across the source, since this plane is re-imaged into the aperture stop of the imaging system and not the mask and wafer planes.

It has thus been shown, that the present invention provides a three spherical mirror critical illumination condenser which satisfies the first order constraints of an imaging system and meets all the technical requirements associated with EUV projection lithography. The critical illumination condenser is versatile enough to work in various imaging systems. The condenser has a symmetric objective, can collect more radiation from the source than the Kohler condenser, and has the ability to scan over the extent of the ring field imaging system.

While a particular embodiment, parameters, etc. have been set forth to exemplify and explain the principles of the invention such are not intended to be limiting. Modifications and changes may become apparent to those skilled in the art, and it is intended that the invention should be limited only be the scope of the appended claims.

The invention claimed is:

1. A critical illumination condenser, comprising:
   a first spherical mirror having a concave reflective surface and a central hole;
   a second spherical mirror having a convex reflective surface, wherein said second spherical mirror together with said central hole of said first spherical mirror define an optical axis; and
   a third spherical mirror having a concave surface, wherein said third spherical mirror is located on said optical axis on an opposite side of said first spherical mirror from said second spherical mirror, wherein said third spherical mirror is tilted with respect to said optical axis,
   wherein energy from a light source is collected by said first spherical mirror and is reflected from said first spherical mirror onto said second spherical mirror, wherein said second spherical mirror reflects said energy through said central hole onto said third spherical mirror, wherein said tilt of said third spherical mirror reflects said energy from said second spherical mirror onto a lithographic mask.

2. The condenser of claim 1, wherein said first spherical mirror and said second spherical mirror are positioned to form an inverse Cassegrain or Schwarzschild configuration.

3. The condenser of claim 2, wherein said third mirror is positioned to reflect energy from said second mirror to a point of use.

4. The condenser of claim 1, wherein said first spherical mirror, said second spherical mirror and said third spherical mirror each include a multilayer reflective surface.

5. The condenser of claim 1, wherein said first mirror has a diameter of 100 mm, said second mirror has a diameter of 12.7 mm, and said third mirror is rectangular and has a dimension of 35 mm by 16 mm.

6. The condenser of claim 5, wherein said concave reflective surface of said first mirror has a curvature of 134.66 mm, said convex reflective surface of said second mirror has a curvature of 22.16 mm, and wherein said concave reflective surface of said third mirror has a curvature of 265.67 mm.

7. In an x-ray projection lithography system, the improvement comprising:

a critical illumination condenser, comprising:

a first spherical mirror having a concave reflective surface and a central hole;

a second spherical mirror having a convex reflective surface, wherein said second spherical mirror together with said central hole of said first spherical mirror define an optical axis; and a third spherical mirror having a concave surface, wherein said third spherical mirror is located on said optical axis on an opposite side of said first spherical mirror from said second spherical mirror, wherein said third spherical mirror is tilted with respect to said optical axis, wherein energy from a light source is collected by said first spherical mirror and is reflected from said first spherical mirror onto said second spherical mirror, wherein said second spherical mirror reflects said energy onto said third spherical mirror, wherein said tilt of said third spherical mirror reflects said energy from said second spherical mirror onto a lithographic mask of said lithography system.

8. The improvement of claim 7, wherein said first spherical mirror and said second spherical mirror are positioned to define an inverse Cassegrain or Schwarzschild configuration.

9. The improvement of claim 8, wherein said configuration has an area obstruction of about 25%, and wherein said third spherical mirror provides a final pupil and image relay of said projection lithography system.

10. The x-ray projection lithography system of claim 7, including a ring field imaging system and a laser produced plasma x-ray source, and wherein said critical illumination condenser reflects radiation produced by said source to said imaging system.

11. The x-ray projection lithography system of claim 10, additionally including a mask intermediate said critical illumination condenser and said imaging system, whereby radiation from said source is directed onto said mask prior to being directed onto said imaging system.

* * * * *